United States Patent
Berkhout et al.

(10) Patent No.: US 9,941,847 B2
(45) Date of Patent: Apr. 10, 2018

(54) SPEAKER DRIVER

(71) Applicant: NXP B.V., Eindhoven (NL)

(72) Inventors: Marco Berkhout, Tiel (NL); Chen Chen, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/347,828

(22) Filed: Nov. 10, 2016

(65) Prior Publication Data

US 2017/0141743 A1 May 18, 2017

(30) Foreign Application Priority Data

Nov. 17, 2015 (EP) .................................... 15195008

(51) Int. Cl.
*H04R 29/00* (2006.01)
*H03F 3/185* (2006.01)
(Continued)

(52) U.S. Cl.
CPC .......... *H03F 3/185* (2013.01); *G01R 31/2825* (2013.01); *H03F 1/52* (2013.01);
(Continued)

(58) Field of Classification Search
CPC .......... H03F 3/185; H03F 1/52; H03F 3/2173; H03F 2200/03; H03F 2200/102;
(Continued)

(56) References Cited

U.S. PATENT DOCUMENTS 8,401,823 B2 3/2013 Klippel
9,473,851 B2 * 10/2016 Galal ..................... H03F 1/523
(Continued)

FOREIGN PATENT DOCUMENTS

EP 2 357 726 A1 8/2011
EP 2 405 675 A1 1/2012

OTHER PUBLICATIONS

Berkout, Marco et al, "A 4Ohm 2.65W Class-D Audio Amplifier with Embedded DC-DC Boost Converter, Current Sensing ADS and DSP for Adaptive Speaker Protection", IEEE Journal of Solid-State Circuits, vol. 48, No. 12, Dec. 1, 2013,pp. 2952-2961.*

(Continued)

*Primary Examiner* — Norman Yu

(57) ABSTRACT

A speaker driver comprising an amplifier, configured to receive a test signal that comprises a plurality of equivalent test-blocks, and provide measurement-signalling for a speaker at the amplifier output. The measurement-signalling comprising a plurality of measurement-blocks, wherein each of the measurement-blocks corresponds to the output of the amplifier for one of the plurality of test-blocks. The speaker driver also includes an output-current-sensor configured to: measure a current level of the measurement-signalling, and provide sensed-signalling that comprises a plurality of sensed-blocks, wherein each of the plurality of sensed-blocks corresponds to one of the plurality of measurement-blocks of the measurement-signalling. The speaker driver further includes a processor configured to either: (a) combine the plurality of sensed-blocks to provide a time-averaged-block; and determine a frequency-spectrum of the time-averaged-block; or (b) determine a frequency-spectrum of each of the plurality of sensed-blocks to provide a plurality of frequency-spectrum-sensed-blocks; and combine the plurality of frequency-spectrum-sensed-blocks to provide a time-averaged-frequency-spectrum-block.

15 Claims, 7 Drawing Sheets

(51) Int. Cl.
*G01R 31/28* (2006.01)
*H03F 3/217* (2006.01)
*H03F 1/52* (2006.01)
*H04R 25/00* (2006.01)
*H04R 3/00* (2006.01)

(52) U.S. Cl.
CPC ......... *H03F 3/2173* (2013.01); *H04R 29/001* (2013.01); *H03F 2200/03* (2013.01); *H03F 2200/102* (2013.01); *H03F 2200/171* (2013.01); *H03F 2200/351* (2013.01); *H03F 2200/393* (2013.01); *H03F 2200/462* (2013.01); *H04R 3/007* (2013.01)

(58) Field of Classification Search
CPC ......... H03F 2200/171; H03F 2200/351; H03F 2200/393; H03F 2200/462; G01R 31/2825; H04R 29/001; H04R 3/007
USPC ......... 381/59, 55, 96, 98, 58, 106, 107, 108, 381/120, 61, 164; 330/129, 278, 279, 330/307, 51
See application file for complete search history.

(56) References Cited

U.S. PATENT DOCUMENTS

| | | |
|---|---|---|
| 2007/0154021 A1 | 7/2007 | Bohman |
| 2011/0228945 A1* | 9/2011 | Mihelich ............... H04R 3/002 381/59 |
| 2013/0170659 A1 | 7/2013 | Guanziroli et al. |
| 2014/0126730 A1 | 5/2014 | Crawley et al. |
| 2014/0270207 A1 | 9/2014 | Vinayak |

OTHER PUBLICATIONS

Berkhout, Marco et al; "A 4Ω 2.65W Class-D Audio Amplifier With Embedded DC-DC Boost Converter, Current Sensing ADS and DSP for Adaptive Speaker Protection"; IEEE Journal of Solid-State Circuits, vol. 48, No. 12; pp. 2952-2961 (Dec. 2013).

Binet Vincent et al: "A fully integrated Class-D amplifier in 40nm CMOS with dynamic cascade bias and load current sensing", 2013 Proceedings of the ESSCIRC, IEEE, Sep. 22, 2014 (Sep. 22, 2014), pp. 319-322, [retrieved on Oct. 31, 2014].

Extended European Search Report for Patent Appln. No. 15195008.6 (dated Jun. 1, 2016).

Klippel; "Rub & Buzz and impulsive distortion"; Retrieved from the Internet https://www.klippel.de/know-how/measurements/non-linear-distortion/rub-buzz-and-impulsive-distortion.html; 7 pages (Nov. 2, 2016).

Knowles Sound Solutions; "Speaker, Donau, Product Overview"; retrieved from the Internet http://www.knowles.com/eng/Products/Receivers-and-speakers/Dynamic-speakers; 9 pages (May 16, 2013).

National Instruments; "Rub & Buzz and High Order Harmonic Analysis Tutorial"; retrieved from the Internet on Nov. 1, 2016 www.ni.com/white-paper/7289/en/; 5 pages (Sep. 27, 2011).

NXP; "TFA9887—Audio system with adaptive sound maximize and speaker protection"; Product short data sheet, Rev. 1; 20 pages (Jul. 11, 2012).

* cited by examiner

SPEAKER DRIVER

CROSS-REFERENCE TO RELATED APPLICATIONS

This application claims the priority under 35 U.S.C. § 119 of European patent application no. 15195008.6, filed Nov. 17, 2015 the contents of which are incorporated by reference herein.

The present disclosure relates to speaker drivers and/or smart amplifiers for driving speakers. In particular, although not necessarily, the present disclosure relates to methods and apparatus for testing and/or characterising the performance of speakers.

According to a first aspect of the present disclosure there is provided a speaker driver comprising an amplifier comprising an amplifier output terminal and an amplifier input terminal, wherein the amplifier is configured to: receive a test signal at the amplifier input terminal, wherein the test signal comprises a series of a plurality of equivalent test-blocks; and provide measurement-signalling for a speaker at the amplifier output, the measurement-signalling comprising a series of a plurality of measurement-blocks, wherein each of the measurement-blocks corresponds to the output of the amplifier for one of the plurality of test-blocks; an output-current-sensor configured to: measure a current level of the measurement-signalling, and provide sensed-signalling as an output, wherein the sensed-signalling comprises a plurality of sensed-blocks, wherein each of the plurality of sensed-blocks corresponds to one of the plurality of measurement-blocks of the measurement-signalling; and a processor configured to either: (a) combine the plurality of sensed-blocks to provide a time-averaged-block; and determine a frequency-spectrum of the time-averaged-block to provide a time-averaged-frequency-spectrum-block; or (b) determine a frequency-spectrum of each of the plurality of sensed-blocks to provide a plurality of frequency-spectrum-sensed-blocks; and combine the plurality of frequency-spectrum-sensed-blocks to provide a time-averaged-frequency-spectrum-block.

In one or more embodiments the amplifier may be a class-D amplifier.

In one or more embodiments each of the plurality of test-blocks may be a portion of a periodic function of time.

In one or more embodiments each of the plurality of test-blocks may consist of an integer number of periods of the periodic function of time.

In one or more embodiments the integer number may be a prime number.

In one or more embodiments the processor may be configured to perform a Fast Fourier Transform in order to determine the frequency-spectrum.

In one or more embodiments the speaker driver may further comprise a signal generator configured to provide the test signal to the amplifier input terminal.

In one or more embodiments the amplifier may comprise an amplifier output stage, and wherein the amplifier output stage may comprise one or more output-stage-FETS; and the output-current-sensor comprises a measurement terminal that may be selectively connectable to the amplifier output stage, such that that the output-current-sensor may be configured to measure a current level of current flowing through the output-stage-FET.

In one or more embodiments the measurement terminal may be configured to be connected to the amplifier output stage when an output-stage-FET is conducting, and disconnected from the amplifier output stage when the associated output-stage-FET is not conducting.

In one or more embodiments the amplifier-output may be coupled to a first output terminal and a second output terminal and the amplifier may comprise: a positive voltage terminal and a negative voltage terminal, a first high-side switch coupled between the positive voltage terminal and the first output terminal; a second high-side switch coupled between the positive voltage terminal and the second output terminal; a first low-side switch coupled between the negative voltage terminal and the second output terminal; and a second low-side switch coupled between the negative voltage terminal and the first output terminal; wherein the first high-side switch, the first low-side switch, the second high-side switch and the second low-side switch may be configurable to provide for: a first conduction pathway between the positive voltage terminal and the negative voltage terminal through the first high-side switch and the first low-side switch; or a second conduction pathway between the positive voltage terminal and the negative voltage terminal through the second high-side switch and the second low-side switch; and wherein: when the first conduction pathway is provided for, the output-current-sensor may be configured to measure the current flowing between the second-output terminal and the negative voltage terminal; and when the second conduction pathway is provided for, the output-current-sensor may be configured to measure the current flowing between the first-output terminal and the negative voltage terminal.

In one or more embodiments the first low-side switch may comprise a first segmented Field Effect Transistor and the second low-side switch may comprise a second segmented Field Effect Transistor, wherein: when the first conduction pathway is provided for, only a subset of the segments of the first segmented Field Effect Transistor may be configured to conduct; and when the second conduction pathway is provided for, only a subset of the segments of the second segmented Field Effect Transistor may be configured to conduct.

In one or more embodiments the speaker driver may further comprise: a low-pass-filter connected to the amplifier output; and a selector-switch configured to selectively connect the ADC to either the output-current sensor or the low-pass-filter; wherein when the low-pass-filter is connected to the ADC, the ADC may be configured to provide a digitized-voltage-representation of an ADC-characterising-output-voltage-signal to the processor, and the processor may be configured to determine an ADC-distortion-spectrum based on a difference between (i) the digitized-voltage-representation of the ADC-characterising-output-voltage-signal; and (ii) an ADC-characterising-input-signal supplied to the amplifier to generate the ADC-characterising-output-voltage-signal.

In one or more embodiments the processor is configured to determine the time-averaged-frequency-spectrum-block based on the ADC-distortion-spectrum.

In one or more embodiments there may be provided an electronic device or an integrated circuit comprising the speaker driver of the present disclosure.

According to a further aspect of the present disclosure there is provided a method of testing a speaker comprising:
  receiving a test signal at an amplifier input terminal of an amplifier, wherein the test signal comprises a series of a plurality of equivalent test-blocks; and
  providing measurement-signalling, for a speaker, at an amplifier output of the amplifier, the measurement-signalling comprising a series of a plurality of measurement-blocks, wherein each of the measurement-blocks corresponds to an output of the amplifier for one of the plurality of test-blocks;

measuring a current level of the measurement-signalling with an output-current-sensor;

providing sensed-signalling as an output of the output-current-sensor, wherein the sensed-signalling comprises a plurality of sensed-blocks, wherein each of the plurality of sensed-blocks corresponds to one of the plurality of measurement-blocks of the measurement-signalling; and either:

(a) combining the plurality of sensed-blocks to provide a time-averaged-block; and determining a frequency-spectrum of the time-averaged-block to provide a time-averaged-frequency-spectrum-block; or (b) determining a frequency-spectrum of each of the plurality of sensed-blocks to provide a plurality of frequency-spectrum-sensed-blocks; and combining the plurality of frequency-spectrum-sensed-blocks to provide a time-averaged-frequency-spectrum-block.

In one or more embodiments the method may further comprise determining if the frequency-spectrum satisfies a predetermined-frequency-spectrum-criterion associated with the speaker.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which.

The acquisition and reproduction of audio signals was among the first applications of electronic circuits. Nowadays, audio electronics are ubiquitous and can be found in television and hi-fi stereo sets, car audio systems and more recently in cellular phones and many other portable applications. The vast majority of these electronics are provided in the form of integrated circuits.

A so-called Smart Speaker Driver may be used in a mobile phone to improve the device's audio performance by driving the device's speaker more intelligently. In the following disclosure the terms 'speaker' and 'loudspeaker' may be used interchangeably and should be interpreted as synonymous terms.

A smart speaker driver may increase acoustic output from a speaker while ensuring that the speaker is not damaged. This may be achieved by predicting a membrane excursion of the speaker and estimating a voice-coil temperature using a speaker model. The membrane excursion is directly related to a Sound Pressure Level (SPL). Differences between the speaker model and real world performance may be reduced by feeding back real-time measurements of the electrical current going into the speaker.

In some examples, a component that is central to a smart speaker driver is a high efficiency class-D amplifier that drives the actual speaker. The amplifier may itself be driven by a digital pulse width modulator (PWM) via a Digital to Analogue Converter (DAC). The amplifier may be supplied with electrical power by a DC-DC (Direct Current to Direct Current) boost converter that may provide a high output power even at a low battery voltage. The DC-DC boost converter is controlled from the digital domain and may only be enabled when high power is needed at the amplifier output. The combined efficiency of the DC-DC boost converter and the amplifier may be improved by performing coarse envelope tracking of the audio signal to determine whether or not a high power is required.

An integrated load current sense Analogue to Digital Converter (ADC) may be configured to measure the electrical current through the speaker. The measured electrical current information may be fed back to an embedded Digital Signal Processor (DSP) that runs a speaker protection algorithm and is also used to improve the quality of the sound by boosting the lower audio frequencies, when appropriate. In mobile device applications miniaturized loudspeakers or so-called micro speakers may be used.

Figure 1:
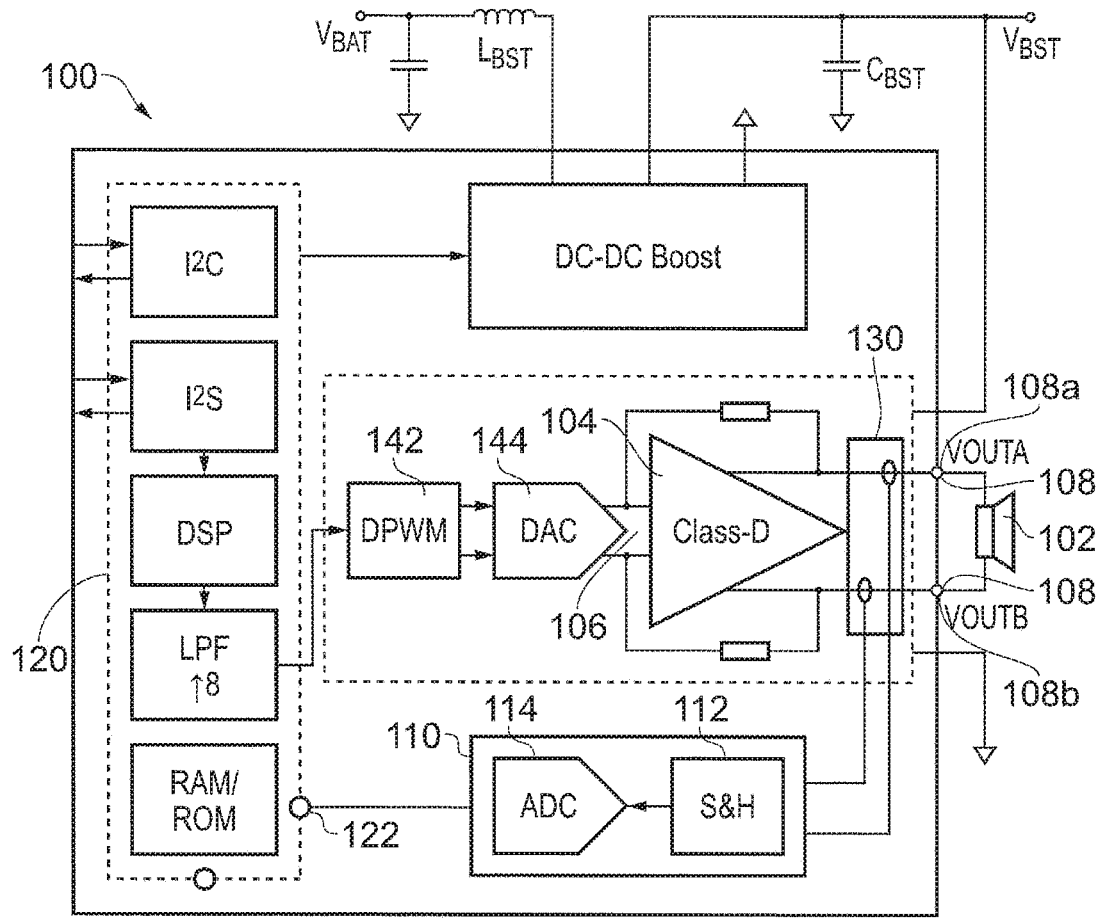
FIG. 1 shows an example embodiment of a smart speaker driver.

FIG. 1 shows a speaker driver 100 coupled to a speaker 102. The speaker driver may also be referred to as a smart speaker driver 100. The smart speaker driver 100 comprises an amplifier 104, which has an amplifier-input 106 and an amplifier-output 108. In this example, the amplifier-output 108 comprises a first output terminal 108a and a second output terminal 108b configured to be connected across the speaker 102. It will be appreciated that other configurations of output are possible.

In a test-mode of operation, the amplifier 104 is configured to receive a test signal at the amplifier-input 106. The test signal comprises a series of a plurality of equivalent test-blocks. The plurality of test-blocks may form a continuous series (that is without any gaps between successive test blocks in the series) or may form a discontinuous series (that is, a gap may be present between successive test blocks in the series). Each one of the test-blocks is equivalent in terms of its frequency spectrum and its duration. In some examples, each test-block may be an identical copy of each other test-block.

When in the test-mode of operation the amplifier 104 provides measurement-signalling to the speaker 102. The measurement-signalling may be configured to drive the speaker 102 in a frequency range that is audible and therefore relevant to the perception, by a user, of sounds reproduced by the speaker 102.

The measurement-signalling comprises a series of a plurality of measurement-blocks because each one of the measurement-blocks corresponds to the output provided by the amplifier 104 in response to a respective test-block provided to the amplifier input 106.

An output-current-sensor 130 is configured to measure a current level of the measurement signalling and to provide sensed-signalling as an output. The sensed-signalling comprises series of a plurality of sensed-blocks because each sensed-block corresponds to a respective one of the plurality of measurement-blocks.

In this example, an optional analogue-to-digital converter (ADC) 110 is configured to receive the plurality of sensed-blocks in series and to provide a digitized-representation of each of the sensed-blocks to a DSP-input-terminal 122 of a processor 120. In this example, the ADC 110 comprises a sample and hold block 112 configured to receive the sensed blocks and to provide a series of analogue values to an ADC-block 114 which is configured to convert the series of analogue values into a series of digitized values that provide a digitized-representation of each sensed-block.

Each sensed-block, and thereby also its digitized representation, provides a measurement of performance of the speaker 102 in response to being driven by equivalent measurement-blocks on a plurality of separate occasions. Since each sensed-block is provided in response to a respective one of each of the test-blocks, and since each test-block is equivalent to each other test-block, it is possible to combine the sensed-blocks together to form a meaningful averaged measurement of the performance of the speaker 102 and amplifier 104 combination.

The processor 120 is configured to combine the plurality of sensed-blocks (in their digitised form, in this example) to provide a time-averaged-block. Many different methods may be employed to combine the sensed-blocks, for example a simple mean average may be computed. In other examples, certain of the sensed-blocks may be discarded or combined with other sensed-blocks according to a weighted average, which may enable the system to deal robustly with statistical outliers. In this way, the combination of sensed-blocks provides a time-averaged-block that is representative of the sensed-current flowing in response to a measurement-block of the measurement-signalling.

An advantage of computing the average is that it serves to increase the signal to noise ratio of the time-averaged-block compared to any individual sensed-block. This is because the noise is essentially random while the signal is consistent from one sensed-block to the next, and therefore the averaging operation reduces the effects of the noise. Further details are provided below.

The processor 120 is further configured to determine a frequency-spectrum of the time-averaged-block to provide a time-averaged-frequency-spectrum-block. Many different techniques may be used to compute the frequency-spectrum, for example, a Fast Fourier Transform may be applied to the time-averaged-block to compute the frequency-spectrum. It will be appreciated that, as an alternative procedure, the frequency-spectrum for each sensed block may be determined first to provide a plurality of frequency-spectrum-sensed-blocks. Then the resulting plurality of frequency-spectrum-sensed-blocks may be combined/averaged to provide a time-averaged-frequency-spectrum-block. This alternative approach provides a mathematically equivalent result, although computation of a plurality of frequency-spectra may be less computationally efficient than the computation of a single frequency-spectrum of the time-averaged-block.

An advantage of computing the frequency-spectrum is that it may provide a representation of the quality/performance of the speaker 102. For example, the frequency-spectrum may enable the identification of defects in the speaker 102 that prejudice its acoustic performance. In some examples the determined frequency-spectrum may be compared to an expected frequency spectrum relevant to the speaker 102. Differences between the measured frequency-spectrum and the expected frequency spectrum may indicate the presence of defects in the speaker 102, particularly where those differences exceed a predetermined threshold.

An advantage of computing the frequency spectrum of the time-averaged-block is that the signal to noise ratio of the resulting frequency-spectrum will be larger than the signal to noise ratio of a frequency spectrum of a single sensed-block. This may enable the identification of more subtle defects than would otherwise be possible.

Combining a plurality of sensed-blocks together is a relatively computationally efficient process. The computation of the frequency spectrum of the time-averaged-block is also a relatively computationally efficient process because the amount of data in the time-averaged-block is relatively small compared to the amount of data in the plurality of sensed-blocks. Since the noise in the sensed-blocks is essentially random, while the signal (which may be indicative of consistent performance defects) is consistent from one sensed-block to the next, the combining or averaging process will combine the signal consistently while the noise will tend to average towards progressively lower levels. It would be possible to compute the frequency spectrum of all of the plurality of sensed-blocks but this would be more time consuming and far less computationally efficient. The present disclosure therefore provides a faster and more computationally efficient way of investigating the performance of, and potential presence of manufacturing defects in, a speaker driven by the smart speaker driver 100 of the present disclosure.

In some examples, the processor 120 may be configured to provide the frequency-spectrum to a DSP-output-terminal (not shown). The frequency-spectrum may then be further analysed, for example during the manufacture of a speaker 102 in order to determine whether the speaker 102 is of acceptable quality or has some manufacturing defect and therefore should be rejected. It will be appreciated that in other examples, the frequency-spectrum may not be provided to an output but may be analysed, as described above, within the processor 120 itself.

In some examples the amplifier 104 may be a class-D amplifier, and in particular may be a full bridge class-D amplifier. In some examples the amplifier 104 may be a half-bridge class-D amplifier, or any other component that can enable the current through the loudspeaker to be measured.

In some examples, each of the plurality of test-blocks may be a portion of a periodic function of time. A particular portion may begin and end at equivalent points within successive periods of the function. That is, each of the test-blocks may consist of an integer number of periods of a periodic function of time. In other examples, each block may consist of an integer number of half periods of the respective periodic function.

In some examples, described further below in relation to FIG. 3, the integer number periods of the periodic function may be a prime number.

In this example, the smart speaker driver 100 further comprises a signal generator configured to provide the test signal to the amplifier input 106. The signal generator comprises the processor 120, a digital pulse width modulator (DPWM) 142 and a Digital-to-Analogue-Converter (DAC) 144 coupled together in series. It will be appreciated that in other examples a test-signal may be provided to an amplifier input by a signal generator that is external to the smart speaker driver 100.

Figure 2:
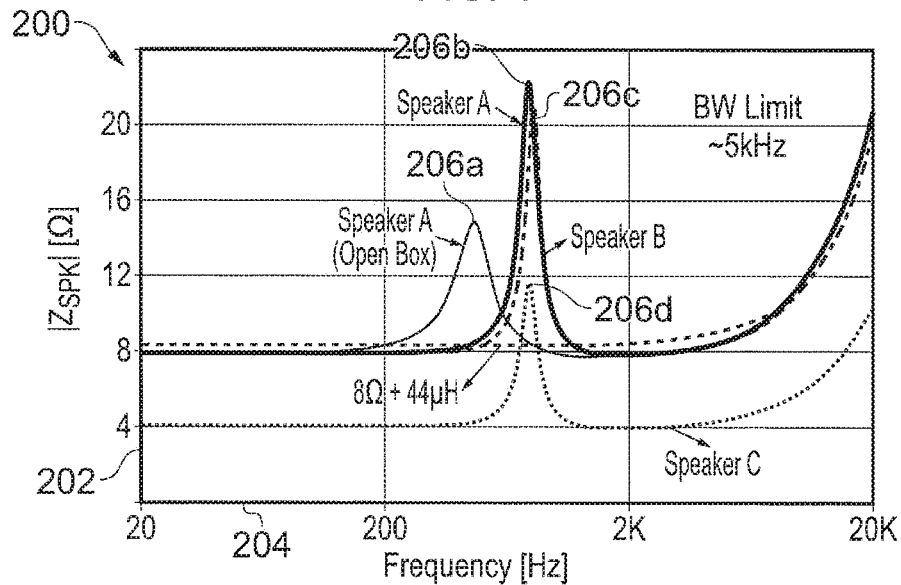
FIG. 2 shows an example of measured values of impedance as a function of frequency for speakers driven by a smart speaker driver.

FIG. 2 shows a chart 200 of some typical impedance characteristics as measured with a current sense ADC, such as the combination of the output-current-sensor and ADC of FIG. 1. The chart 200 plots impedance in Ohms on a vertical axis 202 as a function of frequency on a horizontal axis 204. Clearly visible are the impedance peaks 206(a-d) where the mechanical resonance of a measured speaker occurs.

In volume production of smart speaker driver and speaker combinations it is desirable to test the quality of the speaker and smart speaker driver assembly. Irregular mechanical and structural defects, such as voice coil rubbing in the gap, buzzing parts, loose particles, wire beating, hard limiting of the surround, bottoming of the voice coil former at the back plate, and air noise in leaky enclosures, may generate impulsive distortions that may have little energy but that may generate a wide-band distortion spectrum. Conventional spectral analysis as used for determining the Total Harmonic Distortion (THD) may not be a sufficiently sensitive way of detecting such distortions because these distortions may occur within a fraction of a period of any measurement-signalling. In some test setups a microphone may be used to measure an acoustic output of a smart speaker driver and speaker assembly. In a noisy industrial test environment, at least two microphones may be required to cancel out disturbing ambient noise in order to characterise the performance of a smart speaker driver and speaker assembly by acoustic techniques.

A problem with such an acoustic test setup is cost. The acoustic test takes time that directly translates to manufacturing cost. Also, dedicated test equipment is required to perform the test, which also increase costs. Instead of performing an acoustic measurement using microphones, one or more embodiments disclosed herein can determine the spectral components in the electrical current supplied to the speaker, and therefore identify defects in the speaker, by measuring electrical current instead.

Figure 3:
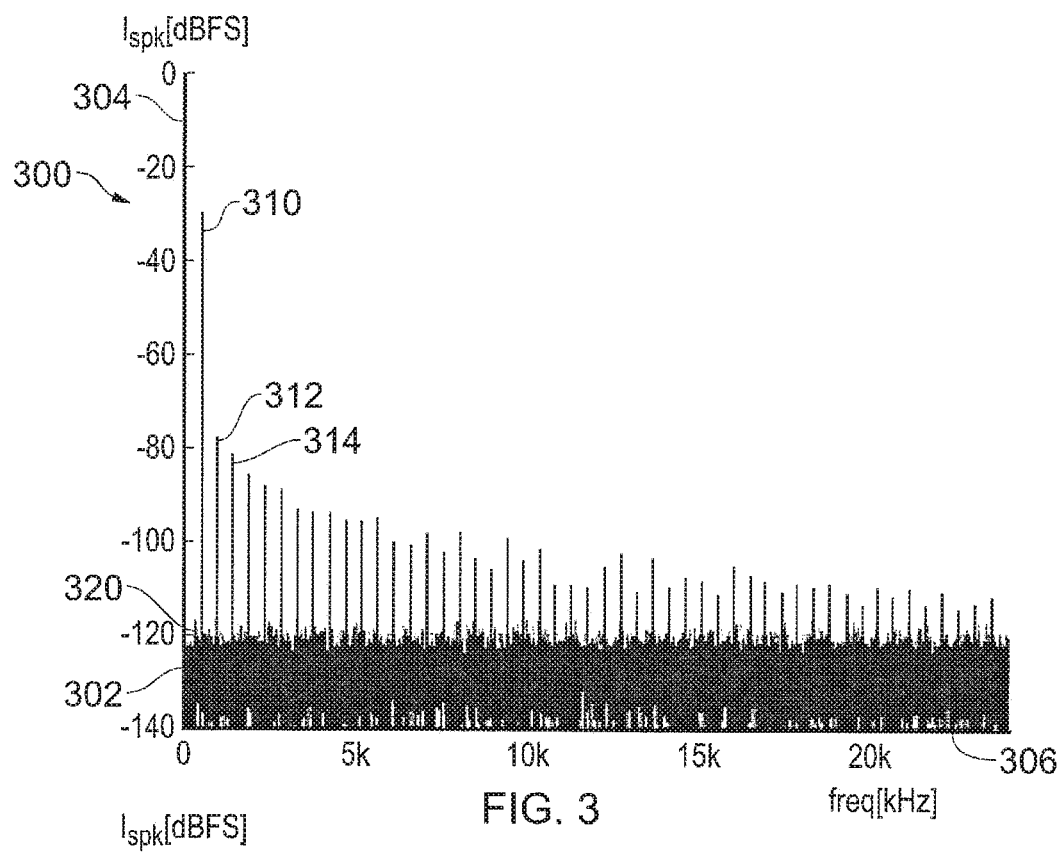
FIG. 3 shows an example of measured values of an electric current in the frequency domain for a speaker with irregular defects driven by a smart speaker driver.

FIG. 3 shows an example chart 300 of a measured frequency spectrum 302 of the current through a speaker with irregular defects when driven with a small sinusoidal measurement signal (which in this example has a frequency of 468 Hz and an amplitude of −30 decibels relative to Full Scale (dBFS)). The chart 300 shows amplitude in dBFS on a vertical axis 304 and frequency on a horizontal axis 306. The frequency spectrum 302 is derived from performing an FFT on 512 sample-blocks, wherein each sample-block consists of 512 samples or measurements. The sampling frequency is 48 kHz, so the duration of the measurement signal on which the FFT is performed is approximately 5.46 s (that is, (512×512)/(48,000) s).

The smart speaker driver used to generate the data 302 shown in FIG. 3 comprises a load current sensing ADC, a DSP (which is configured to perform a Fast Fourier Transform) and a sinewave generator. Since all of the components needed to investigate the performance of the smart speaker driver and speaker assembly may be already included in the smart speaker driver, the quality test of the speaker and smart speaker driver assembly can be executed as a "built-in self-test" (BIST).

This method, of determining performance by measuring a current frequency-spectrum, is less sensitive to disturbance by ambient noise because a speaker is generally a rather poor microphone and therefore does not convert much ambient noise into electrical current within the voice coil. As can be seen in FIG. 3, the measured spectrum has harmonic content in and even beyond the entire audio range although the magnitude of the higher harmonics is very low. For example, although the fundamental 310 (which corresponds to the frequency of the measurement-signalling that drives the speaker) has an amplitude of −30 dBFS, the third harmonic 312 has an amplitude that is scarcely more than −80 dBFS. The fifth harmonic 314 has an amplitude that is slightly less than −80 dBFS. In order to be able to measure the higher harmonics with sufficient accuracy, in order to identify defects in speaker performance, the higher harmonics need to have a higher amplitude than the noise floor 320. In this example the noise floor 320 is situated at around −120 dBFS, and so can allow for the detection of the higher harmonics. In addition, distortions introduced by the load current sense ADC can be a limiting factor for the accuracy of the detection of the higher harmonics, as discussed further below. Noise and distortion effects can be taken care of in the smart speaker driver by adapting the signalling provided to the amplifier. Such adapted signalling may modify the signalling provided by the amplifier to the speaker such that the speaker produces an acoustic output that is closer to a desired output despite the presence of noise or distortion effect within the system; essentially the signalling provided to the speaker may be pre-distorted such that distortions introduced by the speaker result in the desired acoustic output being provided by the speaker.

A current sense ADC may produce significant noise. The typical equivalent input noise voltage of an ADC may be about 3.5 µV RMS in the audio frequency band. A small (−30 dBFS) sinewave across an 8Ω load may typically produce a 550 µV RMS signal at the current sense ADC input yielding a Signal to Noise Ratio (SNR) of only 44 dB. The DSP on the smart speaker driver may have a standard 512-point FFT module. Assuming a 48 kHz sampling rate, 512 samples will require a timeslot of 10.667 ms. An appropriate frequency for the sinewave to drive the loudspeaker would then be 468.75 Hz: at this frequency exactly 5 periods fit into the 512 sample timeslot (a prime number of periods can enable samples to be taken at a maximal number of different phases of the sinewave). Other frequencies may also be used, for example 1031.25 Hz (11 periods) or 2156.25 Hz (23 periods). For the following discussion 468.75 Hz will be used as a specific example.

Figure 4:
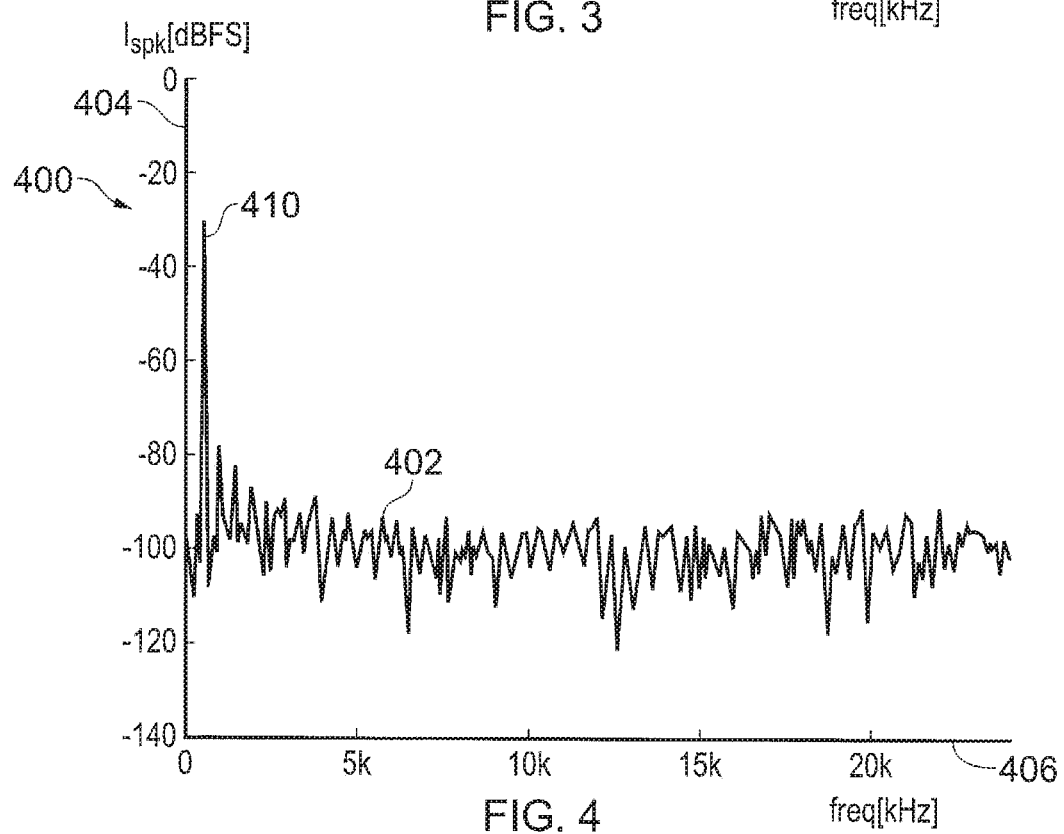
FIG. 4 shows an example of measured values of an electric current similar to FIG. 3 but with a reduced signal to noise ratio.

FIG. 4 shows a chart 400 of a measured frequency-spectrum 402, with amplitude in dBFS shown on a vertical axis 404 and frequency shown on a horizontal axis 406. The frequency-spectrum 402 was generated using the 468.75 Hz setup described above, that is, using a single 512 sample timeslot of approximately 10.667 ms. The fundamental 410 can be seen to have an amplitude of approximately −30 dBFS at the frequency of 468.75 Hz.

In this chart 400 the higher harmonics are swamped in the noise. This situation may be improved by increasing the measurement time.

Figure 5:
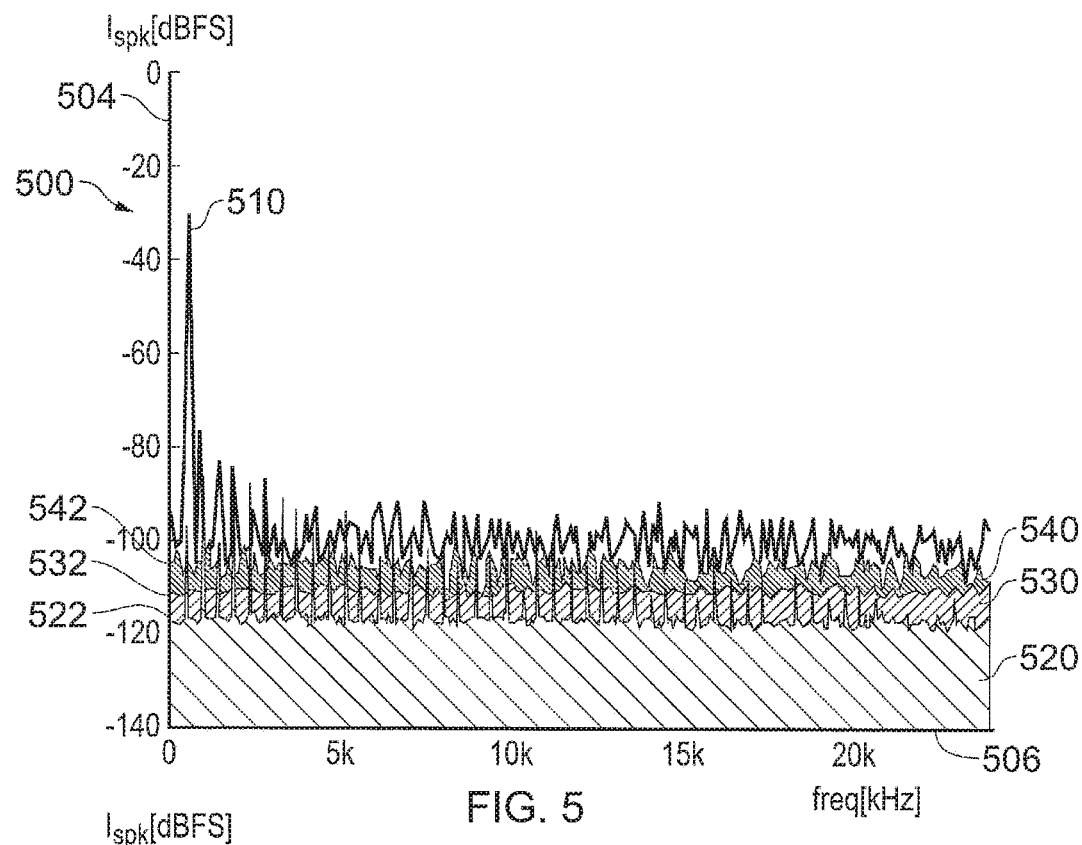
FIG. 5 shows an example of measured values of electric current similar to FIG. 4, but with improved signal to noise ratios provided by increased measurement time.

FIG. 5 shows a chart 500 of frequency spectra obtained as a result of performing an FFT on data obtained from different measurement periods:
- a '512×512' spectrum 520, which is the same as the spectrum shown in FIG. 3, is derived from 512 sequential sample-blocks of 512 samples and has a '512×512' noise floor 522 of approximately −120 dbFS;
- a '64×512' spectrum 530 is derived from 64 sequential sample-blocks of 512 samples and has a '64×512' noise floor 532; and
- a '8×512' spectrum 540 is derived from 8 sequential sample-blocks of 512 samples and has a '8×512' noise floor 542.

Each doubling in measurement time (and therefore sample size) yields a predictable 3 dB reduction in the noise per frequency bin. The '512×512' spectrum 520 may be considered a 'brute force' approach. The brute force approach of simply increasing the time of the measurement, by increasing the number of sensed-blocks incorporated into the measured data, may not be practical in some applications. This approach requires a big (~0.8 MB) memory and a calculation intensive, time consuming 262114-point FFT (that is a 512×512 point FFT to process the 512 sequential sets of 512 measurements or samples). This approach is consequently resource intensive and therefore computationally inefficient.

A more efficient approach, in terms of memory and calculation, may be achieved by first averaging the sample-blocks in the time-domain, before determining the frequency spectrum. As discussed above, the frequency spectrum can be determined by computing a FFT. The averaging may be performed by adding each new sensed-block (which is a set of 512 samples) to the previous sample-block and then dividing by an appropriate multiple to compute a mean average. This procedure is illustrated below in a simple MATLAB® script where:
- x is the sample stream (equivalent to the sensed-signalling);
- X is the 512 word memory (for storing a sensed-block); and
- M is the multiple of 512 (corresponding to the number of sensed-blocks that will be time-averaged):

| | |
|---|---|
| X=0*(1:512); | % 512 words with initial value 0; |
| for n = 1:M*512 | % M times 512 samples |
|    m = 1+mod(n−1,512); | % cyclic index |
|    X(m) = X(m)+x(n); | % accumulate new samples |
| End | |
| X=X/M; | % average |

Figure 6:
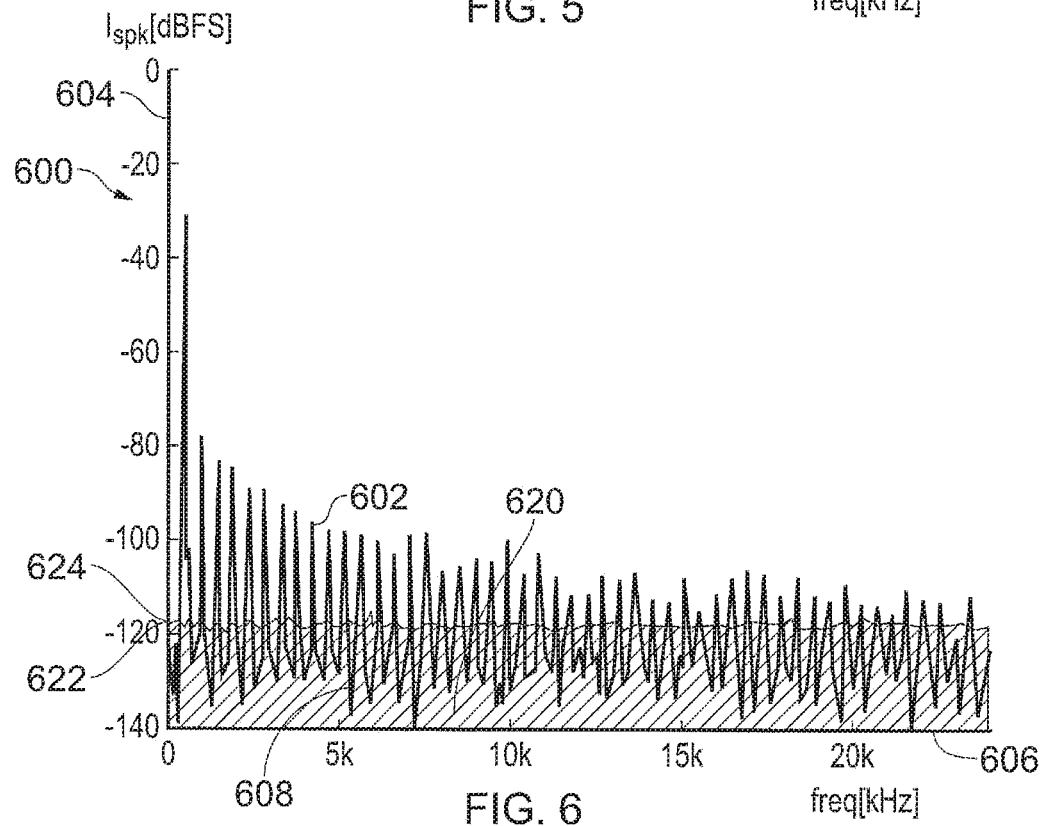
FIG. 6 shows an example of measured values of electric current similar to FIG. 4, but with improved signal to noise ratio provided for by a time averaging method according to an embodiment of the present disclosure.

FIG. 6 shows a chart 600 of a first frequency spectrum 602 calculated by a 512-point FFT applied to the time averaged data provided by the above described procedure. Amplitude in dBFS is shown on a vertical axis 604 and frequency is shown on a horizontal axis 604. The frequency spectrum 602 computed for the value M=512 (that is, a time-averaged value of 512 sensed-blocks) is shown as a first, solid, line in the chart 600.

Also shown in FIG. 6 is a second frequency spectrum 608 provided by a 512×512-point FFT computed from the same sample train as the first frequency spectrum 602, without any time domain averaging. The harmonics of the first frequency spectrum 602 essentially overlap the harmonics of the second frequency spectrum 608. However, since the second frequency spectrum 608 is based on a FFT performed on a much larger data set (512 times larger) the second frequency spectrum 608 is illustrated as a solid (cross-hatched) block of signal 620 below the second frequency spectrum noise floor 622, which is situated at approximately −120 dBFS. The first frequency spectrum 602 is shown as a single solid line both below and above the first frequency spectrum noise floor 624, which is situated at the same level as the second frequency spectrum noise floor 622.

As can be seen, the amplitude value of the frequency bins at the harmonics is equal in both the first frequency spectrum and the second frequency spectrum; they are in fact mathematically identical. In order to classify a defective speaker from this frequency domain information, the amplitude values of the frequency bins at the higher harmonics, provides sufficient information. Use of the first frequency spectrum 602 is advantageous because it contains the same relevant frequency domain information required to classify a defective speaker as the second line 608, but the first frequency spectrum 602 only required the computation of a 512-point FFT whereas the second line 608 was generated by a much more computationally intensive 262144-point FFT (that is a 512×512-point FFT).

A value of M=512 (that is, 512 sensed-blocks) translates into a measurement time of 512×512/48 kHz=5.46 s, which can be too long in some applications. However, the impact of this long measurement time can be lessened in some examples because multiple speakers can be tested in parallel since no external measurement equipment, such as microphones, is required. Alternatively, if the SNR of the current sense signal is increased, less time domain averaging, and thus fewer sensed-blocks, and therefore less measurement time, is required.

Figures 7A, 7B:
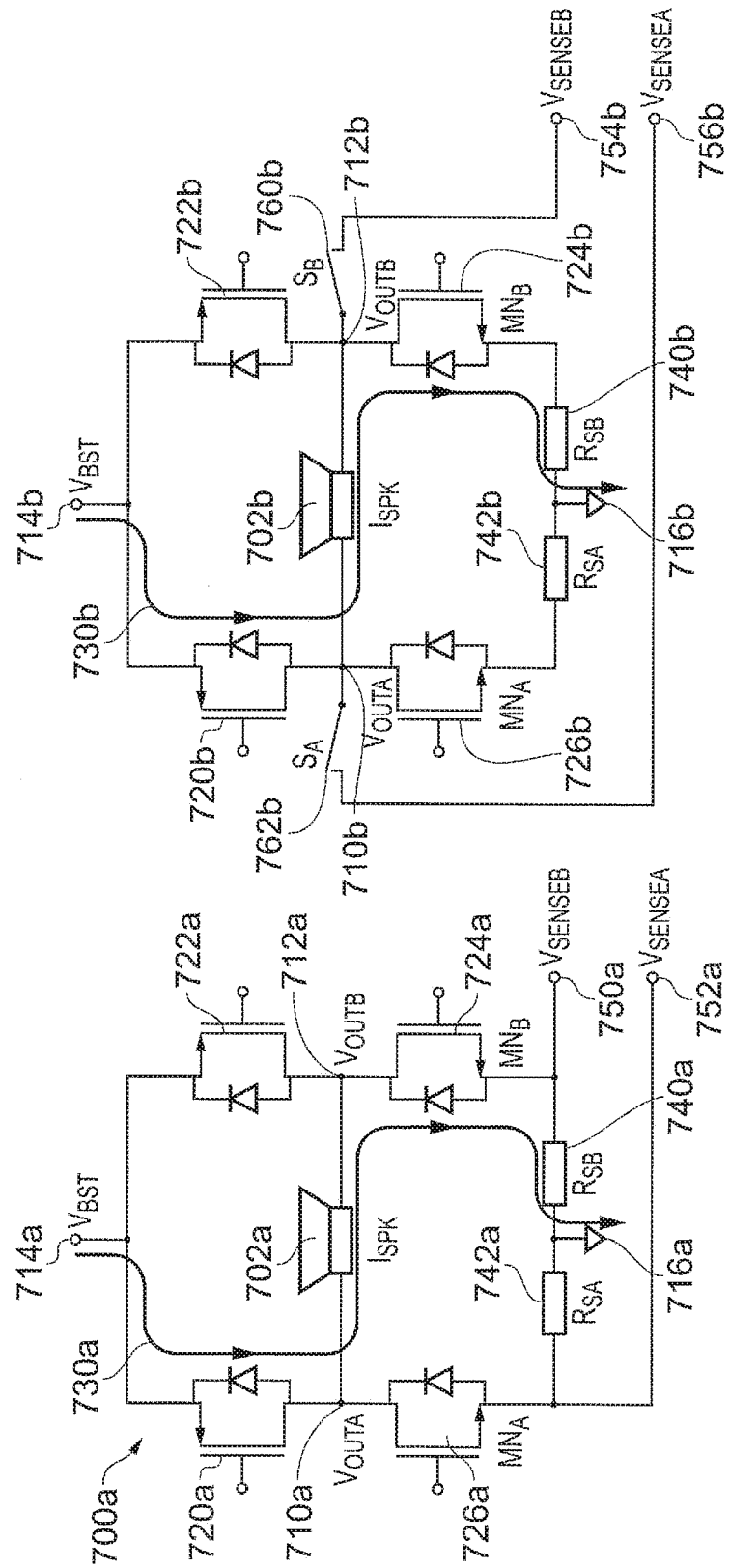
FIG. 7a shows an example embodiment of part of a smart speaker driver.
FIG. 7b shows an example embodiment of part of a smart speaker driver.

FIG. 7a shows an output stage 700a of a class-D amplifier configured for current sensing of current supplied by the amplifier to a speaker 702a. In this example, the current through the speaker 702a is measured using, for example, 20 mΩ sense resistors ($R_{SA}$ and $R_{SB}$). The voltage ($V_{SENSEA}$ or $V_{SENSEB}$) across the sense resistors may be the input signal for the Analogue to Digital Converter shown in FIG. 1.

The amplifier is coupled to a first output terminal 710a and a second output terminal 712a. In a similar way to the arrangement of FIG. 1, the speaker 702a is shown connected between the first output terminal 710a and the second output terminal 712a.

The amplifier output stage 700a comprises:
- a positive voltage terminal 714a and a negative voltage terminal 716a;
- a first high-side switch 720a coupled between the positive voltage terminal 714a and the first output terminal 710a;
- a second high-side 722a switch coupled between the positive voltage terminal 714a and the second output terminal 712a;
- a first low-side switch 724a coupled between the negative voltage terminal 716a and the second output terminal 712a; and a second low-side switch 726a coupled between the negative voltage terminal 716a and the left output terminal 710a.

The first high-side switch 720a and the first low-side switch 724a are configurable to provide for a first conduction pathway 730a between the positive voltage terminal 714a and the negative voltage terminal 716a. The second high-side switch 722a and the second low-side switch 726a are configurable to provide for a second, alternative, conduction pathway (not shown) between the positive voltage terminal 714a and the negative voltage terminal 716a. The second conduction pathway is essentially a mirror image of the first conduction pathway 730a, with a mirror plane that extends out of the figure and bisects the figure between the positive voltage terminal 714a and the negative voltage terminal 716a.

In this example, the output-current-sensor comprises a first-measurement-resistor 740a disposed in the first conduction pathway 730a and a second-measurement-resistor 742a disposed in the second conduction pathway. The first-measurement-resistor 740a is provided in series with, and between the negative voltage terminal 716a and the first low-side switch 724a. When the first high-side switch 720a and the first low-side switch 724a are closed and provide the first conduction pathway 730a, the output-current-sensor is configured to measure the current through the first-measurement-resistor 740a. Such a measurement may be made by measuring a voltage between a first measurement terminal 750a and the negative voltage terminal 716a, thereby measuring the voltage across the first-measurement-resistor 740a. When the second high-side switch 722a and the second low-side switch 726a are closed and provide the second conduction pathway, the output-current-sensor is configured to measure the current through the second-measurement-resistor 742a. Such a measurement may be made by measuring a voltage between a second measurement terminal 752a and the negative voltage terminal 716a, thereby measuring the voltage across the second-measurement-resistor 742a.

Determining a preferred resistance value of the sense resistors 740a, 742a involves making a compromise between SNR and efficiency: a higher value of resistance would increase the signal power going to the ADC but would also increase dissipation. Since the speaker test is typically done with a small (for example, −30 dBFS) signal, dissipation is not a significant concern so a higher resistance value of the sense resistors may be preferred. It may not, however, be practical to make the sense resistors switchable since this would require switches with less than 20 mW on-resistance which would require a large area of silicon if implemented as part of a silicon chip.

FIG. 7b shows an alternative amplifier output stage compared to that of FIG. 7a. Features of FIG. 7b that are similar to features of FIG. 7a have been given similar reference numerals and may not necessarily be discussed further here. FIG. 7b includes a first measurement switch 760b connected between a second-output terminal 712b and a first measurement terminal 754b of the output-current-sensor. The first measurement switch 760b can selectively connect or disconnect the second-output terminal 712b to the first measurement terminal 754b. FIG. 7b includes a second measurement switch 762b connected between a first-output terminal 710b and a second measurement terminal 756b of the output-current-sensor. The second measurement switch 762b can selectively connect or disconnect the first-output terminal 710b to the second measurement terminal 756b.

When a first high-side switch 720b and a first low-side switch 724b are closed in order to provide a first conduction pathway 730b, the output-current-sensor is configured to measure the current flowing between a second-output terminal 712b and a negative voltage terminal 716b. That is, the current sensor measures current/voltage associated with the series connection of the first-measurement-resistor 740b and the first low-side switch 724b. This may be achieved by closing the first measurement switch 760b to connect the second-output terminal 712b to the first measurement terminal 754b of the output-current-sensor. Thereby, the voltage measured may be significantly larger than that described above in relation to FIG. 7a because the resistance of the first low-side switch 724b may be significantly larger than that of a measurement resistor 740b. This larger resistance may be naturally provided where the first low-side switch 724b is a power Field Effect Transistor (FET) such as an n-type Metal Oxide Semiconductor (NMOS) Field Effect Transistor.

When the second high-side switch 722b and the second low-side switch 726b are closed in order to provide for the second conduction pathway the output-current-sensor may be configured to measure the current flowing between the left-output terminal 710b and the negative voltage terminal 716b. This may be achieved by closing the second measurement switch 762b to connect the first output terminal 710b to the second measurement terminal 756b of the output-current-sensor.

Generally, any of the high-side or low-side switches disclosed above may be implemented using NMOS or any other type of power FET. It will be appreciated that when a particular current measurement is being performed, the relevant one of the first measurement switch 760b and the second measurement switch 762b will be closed, while at other times these switches will be open, to disconnect the relevant part of the output stage 700b from the output-current-sensor.

The on-resistance of an NMOS power FET is typically around 200 mΩ giving a 10× increase in signal amplitude, compared to a measurement of a 20 mΩ resistor as disclosed above. This would yield a 20 dB improvement in SNR of the signal going to the Analogue to Digital Converter. Consequently a 100-fold reduction in measurement time can be achieved to achieve the same accuracy compared to measuring through only the sense resistors, as in FIG. 7a.

The example of FIG. 7b can be summarised as an output-current-sensor having measurement terminals 754b, 756b that are selectively connectable to an amplifier output stage, such that the output-current-sensor provides sensed signalling that is representative of current flowing through, and/or voltage dropped across, an output-stage-FET that comprises part of the amplifier output stage. The individual measurement terminals 754b, 756b can be connected to an output terminal 710b, 712b when an associated output-stage-FET is conducting, and disconnected from the output terminal 710b, 712b when the associated output-stage-FET is not conducting.

In some examples the power FETs in the class-D amplifier may be segmented. A segmented FET comprises a plurality of sub-transistors coupled together in parallel. In this way, the greater the number of segments (or sub-transistors) that are electrically conducting, the greater the current that can be conducted for a particular voltage, because the resistance of the segmented transistor will be reduced. Conversely, if only a subset of the segments are electrically conducting the resistance of the segmented transistor will be higher. A further increase in signal amplitude and corresponding reduction in measurement time can thereby be achieved by switching only a fraction, or subset, of the segments. The subset to be switched will be less than the total number of segments and may be equal to one half, one third, one quarter, one tenth, or any other convenient fraction less than the total number of segments of the segmented transistor. For example, switching only half of the segments gives a 6 dB increase in SNR and a 4× reduction in measurement time. In this way the measurement time may be reduced to less than 100 ms.

A potential drawback of increasing the signal amplitude to improve SNR is that the distortion of the ADC can become more significant as the ADC's distortion may be non-linear and therefore have a greater effect for higher amplitude inputs. A current sense ADC may have a modest total harmonic distortion (THD) performance, for example, typically −70 dB for a 5 mV RMS input signal.

Figure 8:
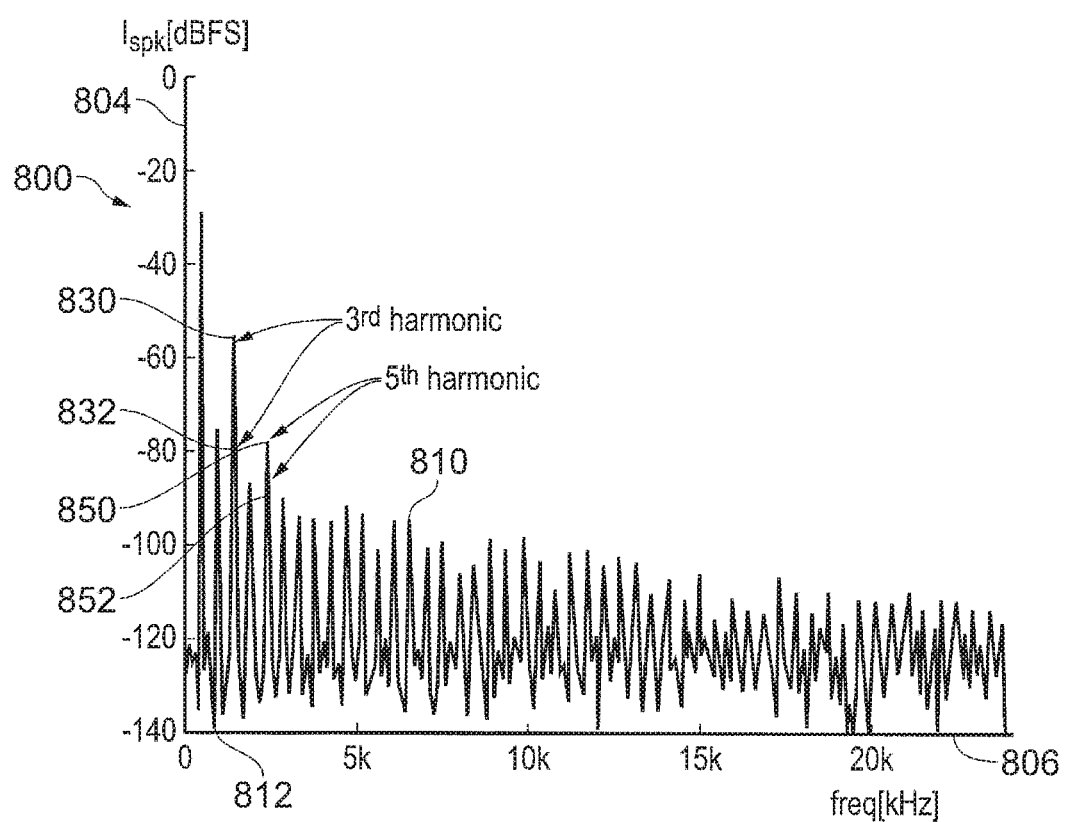
FIG. 8 shows an example of measured values of electric current in the frequency domain that provide information about a non-linear response of a current sense analogue to digital converter (ADC)

FIG. 8 shows a chart 800 that illustrates data showing the distortion that may be introduced by an ADC. The chart shows amplitude on a vertical axis 804 and frequency on a horizontal axis 806. An ideal (linear) ADC frequency spectrum 810 is shown substantially overlapping a non-ideal (weakly non-linear) ADC frequency spectrum 812. FIG. 8 illustrates that the ADC distortion is mainly confined to the $3^{rd}$ and $5^{th}$ harmonics. The $3^{rd}$ harmonic 830 and the $5^{th}$ harmonic 850 of the non-ideal ADC frequency spectrum 812 are both significantly larger (more than 10 dBFS larger) than the $3^{rd}$ harmonic 832 and the $5^{th}$ harmonic 852, respectively, of the ideal ADC frequency spectrum 810. In this case the difference at the higher harmonics, above the $5^{th}$ harmonic, is within a ±3 dBFS range. Thus, distortions introduced by the ADC have a distinctly different signature than the distortions caused by irregular defects in a speaker, which are shown in FIG. 6.

A pragmatic solution, to the problem of non-linear distortion introduced by the ADC, would be to simply ignore the lower harmonics (the $3^{rd}$ and $5^{th}$ harmonics, for example) and only consider the higher harmonics for the detection of irregular defects. Although the magnitude of the higher harmonics is also affected by the ADC distortion it may be assumed that higher harmonics may only occur if they are already present in the speaker current signal. The existence of harmonics above the $5^{th}$ order may be considered as an indication of the presence of irregular defects in the speaker.

Alternatively, post-correction processing can be performed to eliminate, or reduce, the effect of ADC distortions on the final frequency spectrum. For this, the distortion of the ADC needs to be characterized. This may be achieved by using the output voltage of the class-D amplifier as an input signal for the ADC. Such processing will be described below in relation to FIG. 9.

Figure 9:
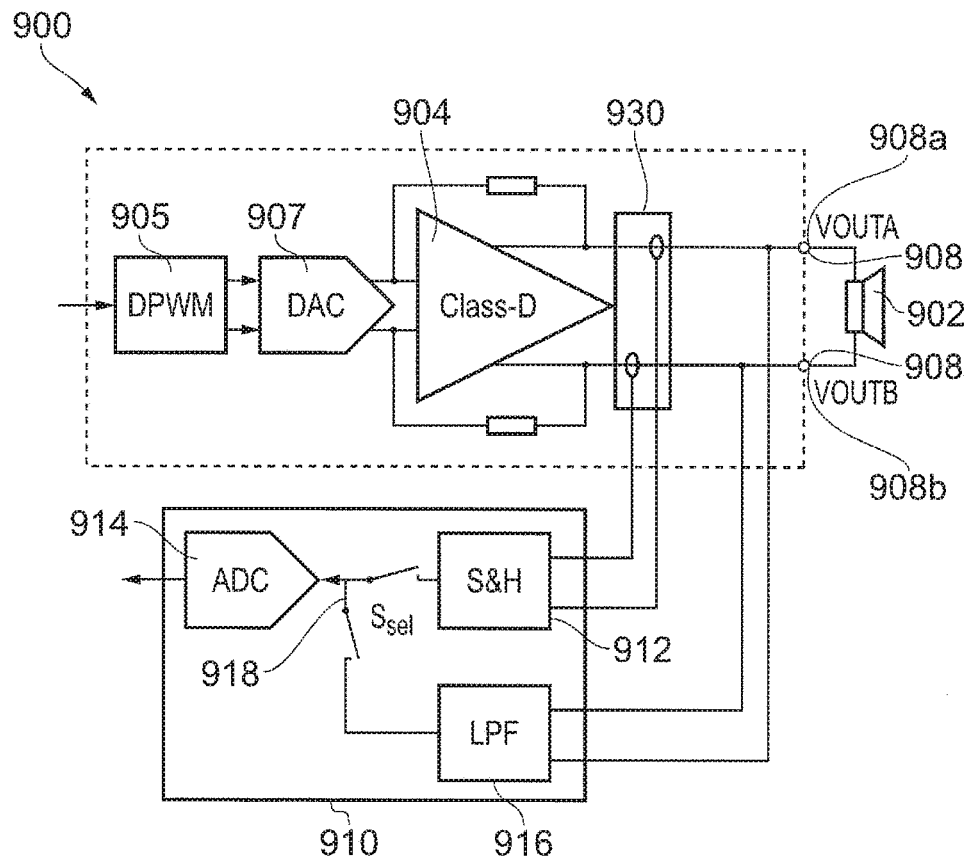
FIG. 9 shows a schematic diagram of an example embodiment of part of a smart speaker driver configured to characterise a non-linear response of a current sense ADC.

FIG. 9 shows a block diagram of part of a smart speaker driver 900 according to the present disclosure. Features of FIG. 9 that are similar to features of FIG. 1 have been given similar reference numerals, and may not be further discussed here.

The smart speaker driver 900 comprises a low-pass-filter 916 that is connected to the amplifier-output 908. The smart speaker driver 900 also comprises a selector-switch 918 configured to selectively connect an input of the ADC block 914 to either: (i) an output of the output-current sensor 930 (via a Sample and Hold block 912) or (ii) an output of the low-pass-filter 916. When the ADC block 914 is connected to the low-pass-filter 916 it will be disconnected from the Sample and Hold block 912, and vice versa. As will be discussed in more detail below with reference to FIG. 10, the low-pass-filter 916 can be used to provide an idealised model of the behaviour of a speaker 902.

When the low-pass-filter 916 is connected to the ADC block 914 via the selector-switch 918, the smart speaker driver can be considered as being in an ADC-characterisation mode of operation. In this mode of operation, the amplifier can be said to receive an ADC-characterising-input-signal (which may or may not be the same as the test signal described above), and provide an ADC-characterising-output-voltage-signal, which is then processed by the low-pass-filter 916. In some examples the ADC-characterising-output-voltage-signal may be a sinewave with a frequency in the audible range. Beneficially for this mode of operation, such a voltage signal is not influenced by any imperfections in the speaker 902.

It is recalled that the current at the output of the amplifier 904 is influenced by imperfections in the speaker 902, which is why such a current signal can be used to characterise the performance of the speaker 902 when the smart speaker driver test-mode of operation, and the output of the Sample and Hold block 912 is connected to the input of the ADC block 914.

In the ADC-characterisation mode of operation, the ADC block 914 is configured to provide a digitized-voltage-representation of the ADC-characterising-output-voltage-signal to a digital signal processor (not shown). The digitized-voltage-representation of the ADC-characterising-output-voltage-signal and the ADC-characterising-input-signal can be used to determine the non-linear response of the ADC block 914 as a function of frequency, as discussed below.

The digital signal processor may be configured to determine an ADC-distortion-spectrum based on a difference between (i) the digitized-voltage-representation of the ADC-characterising-output-voltage-signal; and (ii) the ADC-characterising-input-signal. The non-linearity of the amplifier may either be known or may be assumed to be zero for a sufficiently small test-input signal. Comparison of these signals may therefore enable the determination of the non-linear response of the ADC because it should only be the ADC that causes any change to the frequency components of the signals. Expressed in the frequency domain, the nonlinearity of the ADC response may be described as an ADC-distortion-spectrum.

Computation of the frequency-spectrum may then be based on a frequency-domain-representation of the time-averaged-digitized-representation and the ADC-distortion-spectrum, by for example subtracting at least part of the ADC-distortion-spectrum (such as the $3^{rd}$ and $5^{th}$ harmonics) from the frequency-domain-representation of the time-averaged-digitized-representation. In this way it may be possible to remove, or reduce, the non-linear effects of the ADC and thereby use all of the harmonics of the frequency spectrum to detect and/or characterise any undesired behaviour of the speaker 902.

Figure 10:
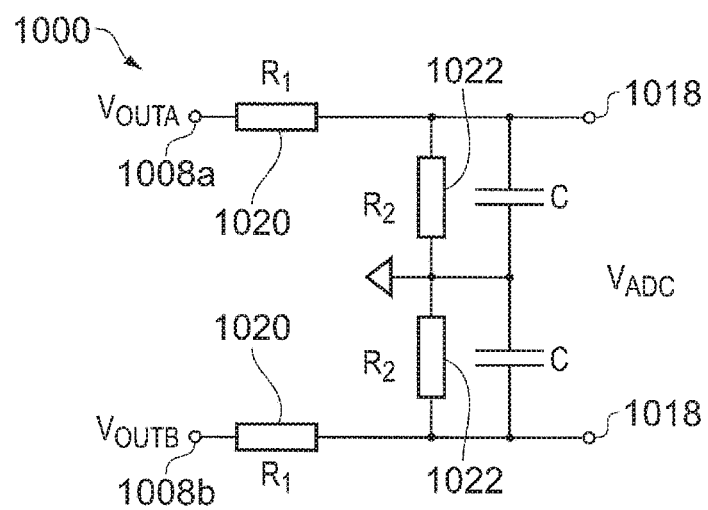
FIG. 10 shows an example of a low-pass filter that may be used with a smart speaker driver to characterise a non-linear response of a current sense ADC.

FIG. 10 shows a passive low-pass filter 1000 that may be used as the low-pass-filter that is shown in FIG. 9. Such a low-pass filter 1000 can be used to adjust a class-D amplifier output signal such that it matches the ADC input range. The passive low-pass filter 1000 comprises a first input 1008a and a second input 1008b that may be coupled to the first and second amplifier outputs shown in FIG. 9. To characterize distortions introduced by the ADC, the signal provided by the low-pass-filter 1000 may be normalized to have the same magnitude as the signal provided by the Sample and Hold block shown in FIG. 9. The differential voltage ($V_{OUTA} - V_{OUTB}$) between the first input terminal 1008a and the second input terminal 1008b may therefore be modified by the low-pass-filter 1000 by a normalizing-factor. In this example the low-pass-filter 1000 comprises a pair of first resistors 1020 each with resistance $R_1$ and a pair of second resistors 1022 each with resistance $R_2$. The skilled person will thus understand that the normalizing-factor in this example is equal to $R_2/(R_1+R_2)$. The passive low-pass filter 1000 further comprises an output 1018 that may be coupled to the input of the ADC shown in FIG. 9, to provide the normalized signal to the ADC. The output of the passive low-pass filter 1000 may thereby provide an idealised model of the behaviour of a speaker that is free from any defects, as described further below.

A speaker may, to a first order, be approximated with a series connection of a resistor and an inductor. By choosing the cut-off frequency of the low-pass filter 1000 approximately equal to the cut-off frequency of the speaker, the spectral content around the PWM frequency is comparable to that of the current sense signal. Furthermore, the output signal can be attenuated to match the input range of the ADC. The distortion of the class-D amplifier can be considered negligible since the output signal level is low (for example, −30 dBFS). Using the low-pass filtered, undistorted class-D output voltage as a reference signal, the nonlinear transfer function $f(x)$ of the ADC can be determined.

This determination may be achieved by comparing the output from the ADC when coupled to the passive low-pass filter 1000 with an ADC-characterising-input-signal that is supplied to the amplifier. Comparing a model of what an ideal ADC should produce, when driven by the amplifier supplied with the known test blocks, with the signalling produced by the ADC when driven via the passive low-pass filter, can enable the nonlinear transfer function of the ADC to be determined.

From this nonlinear transfer function, the inverse transfer function $f^{-1}(x)$ can be approximated by a Taylor-series, or a lookup-table (LUT) or a database. This inverse transfer function can then be used to correct the output of the ADC when the smart speaker driver is in the test-mode of operation (as described with reference to FIG. 1), before an FFT is performed on a time-averaged-block.

One or more examples described in the present disclosure may be applied in mobile phones, portable devices and other electronic devices. The examples may be implemented in an integrated circuit or chip.

Figure 11:
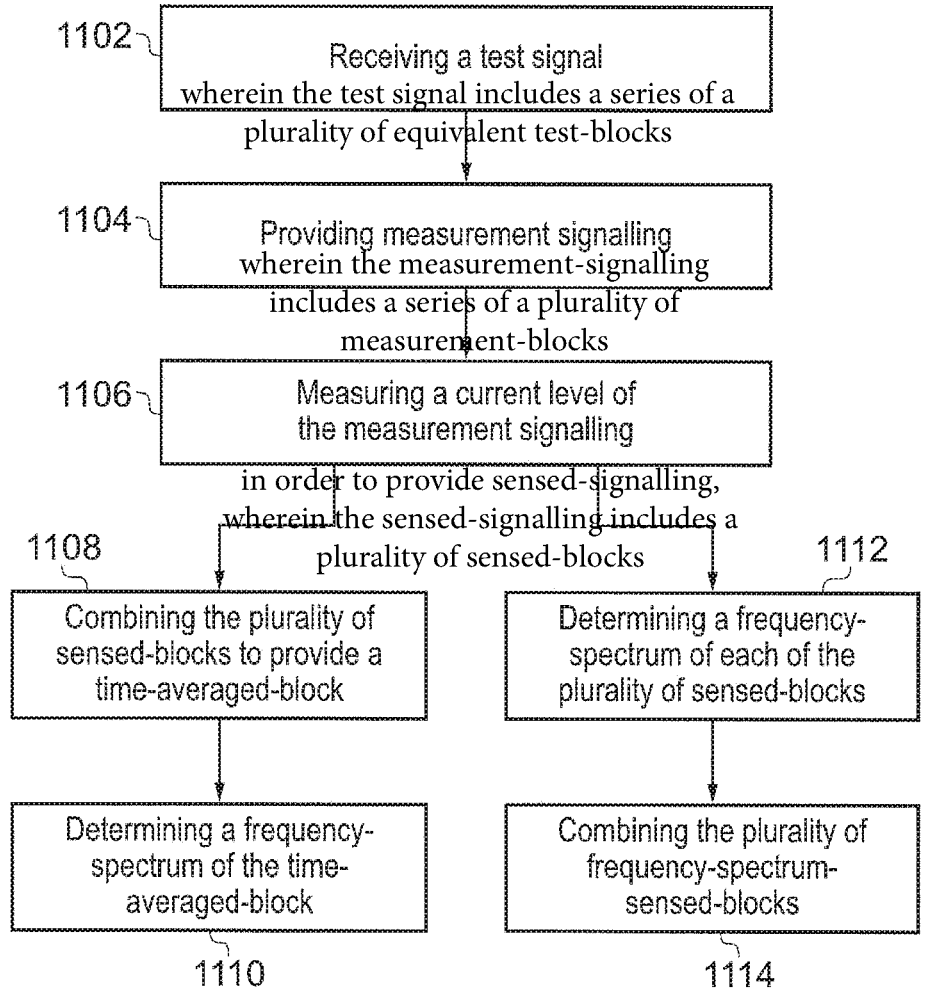
FIG. 11 shows an example embodiment of a method of testing a speaker depicted as a flowchart of method steps.

FIG. 11 shows a flowchart 1100 that depicts a method of testing a speaker. The method comprises, at step 1102, receiving a test signal at an amplifier input terminal of an amplifier, wherein the test signal comprises a series of a plurality of equivalent test-blocks.

At step 1104, the method comprises providing measurement-signalling, for a speaker, at an amplifier output of the amplifier. The measurement-signalling comprising a series of a plurality of measurement-blocks, wherein each of the measurement-blocks corresponds to an output of the amplifier for one of the plurality of test-blocks.

At step 1106, the method comprises measuring a current level of the measurement-signalling in order to provide sensed-signalling, wherein the sensed-signalling comprises a plurality of sensed-blocks, and wherein each of the plurality of sensed-blocks corresponds to one of the plurality of measurement-blocks of the measurement-signalling.

The method branches after step 1106, with two alternative ways of provide a time-averaged-frequency-spectrum-block based on the same general functionality. In a first branch, the method comprises: combining the plurality of sensed-blocks to provide a time-averaged-block at step 1108; and determining a frequency-spectrum of the time-averaged-block to provide a time-averaged-frequency-spectrum-block at step 1110.

In a second branch, the method comprises: determining a frequency-spectrum of each of the plurality of sensed-blocks to provide a plurality of frequency-spectrum-sensed-blocks at step 1112; and combining the plurality of frequency-spectrum-sensed-blocks to provide a time-averaged-frequency-spectrum-block at step 1112.

In some examples, the method may further comprise the step (not shown) of determining if the time-averaged-frequency-spectrum-block satisfies a predetermined-frequency-spectrum-criterion associated with the speaker. In this way, defective speakers may be identified as those that fail to satisfy the predetermined-frequency-spectrum-criterion, and appropriate remedial action may then be taken.

In a smart speaker driver the current through the loudspeaker may be measured with a current sense ADC. This current information may be used to characterize the speaker. Irregular speaker defects may generate impulsive acoustic distortions which have little energy but generate a wideband spectrum. This spectrum can be measured with the current sense ADC which results in a cheap and fast assembly line test for speakers and smart speaker driver/speaker assemblies.

The instructions and/or flowchart steps in the Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A speaker driver comprising
an amplifier comprising an amplifier output terminal and
an amplifier input terminal, wherein the amplifier is configured to:
receive a test signal at the amplifier input terminal, wherein the test signal comprises a series of a plurality of equivalent test-blocks; and
provide measurement-signalling for a speaker at the amplifier output, the measurement-signalling comprising a series of a plurality of measurement-blocks, wherein each of the measurement-blocks corresponds to the output of the amplifier for one of the plurality of test-blocks;
an output-current-sensor configured to:
measure a current level of the measurement-signalling, and
provide sensed-signalling as an output, wherein the sensed-signalling comprises a plurality of sensed-blocks, wherein each of the plurality of sensed-blocks corresponds to one of the plurality of measurement-blocks of the measurement-signalling; and
a processor configured to either:
combine the plurality of sensed-blocks to provide a time-averaged-block; and determine a frequency-spectrum of the time-averaged-block to provide a time-averaged-frequency-spectrum-block; or
determine a frequency-spectrum of each of the plurality of sensed-blocks to provide a plurality of frequency-spectrum-sensed-blocks; and
combine the plurality of frequency-spectrum-sensed-blocks to provide a time-averaged-frequency-spectrum-block.

2. The speaker driver of claim 1, wherein the amplifier is a class-D amplifier.

3. The speaker driver of claim 1, wherein each of the plurality of test-blocks is a portion of a periodic function of time.

4. The speaker driver of claim 3, wherein each of the plurality of test-blocks consists of an integer number of periods of the periodic function of time.

5. The speaker driver of claim 4, wherein the integer number is a prime number.

6. The speaker driver of claim 1, wherein the processor is configured to perform a Fast Fourier Transform in order to determine the frequency-spectrum.

7. The speaker driver of claim 1, further comprising a signal generator configured to provide the test signal to the amplifier input terminal.

8. The speaker driver of claim 1, wherein:
the amplifier comprises an amplifier output stage, and wherein the amplifier output stage comprises one or more output-stage-FETS; and
the output-current-sensor comprises a measurement terminal that is selectively connectable to the amplifier output stage, such that the output-current-sensor is configured to measure a current level of current flowing through the output-stage-FET.

9. The speaker driver of claim 8, wherein the measurement terminal is configured to be connected to the amplifier output stage when an output-stage-FET is conducting, and disconnected from the amplifier output stage when the associated output-stage-FET is not conducting.

10. The speaker driver of claim 1, wherein the amplifier-output is coupled to a first output terminal and a second output terminal and the amplifier comprises:
a positive voltage terminal and a negative voltage terminal
a first high-side switch coupled between the positive voltage terminal and the first output terminal;
a second high-side switch coupled between the positive voltage terminal and the second output terminal;
a first low-side switch coupled between the negative voltage terminal and the second output terminal; and
a second low-side switch coupled between the negative voltage terminal and the first output terminal;
wherein the first high-side switch, the first low-side switch, the second high-side switch and the second low-side switch are configurable to provide for:
a first conduction pathway between the positive voltage terminal and the negative voltage terminal through the first high-side switch and the first low-side switch; or
a second conduction pathway between the positive voltage terminal and the negative voltage terminal through the second high-side switch and the second low-side switch; and wherein:
when the first conduction pathway is provided for, the output-current-sensor is configured to measure the current flowing between the second-output terminal and the negative voltage terminal; and
when the second conduction pathway is provided for, the output-current-sensor is configured to measure the current flowing between the first-output terminal and the negative voltage terminal.

11. The speaker driver of claim 10, the first low-side switch comprising a first segmented Field Effect Transistor and the second low-side switch comprising a second segmented Field Effect Transistor, wherein:
when the first conduction pathway is provided for, only a subset of the segments of the first segmented Field Effect Transistor are configured to conduct; and
when the second conduction pathway is provided for, only a subset of the segments of the second segmented Field Effect Transistor are configured to conduct.

12. The speaker driver of claim 1, further comprising:
a low-pass-filter connected to the amplifier output; and
a selector-switch configured to selectively connect the ADC to either the output-current sensor or the low-pass-filter;
wherein when the low-pass-filter is connected to the ADC, the ADC is configured to provide a digitized-voltage-representation of an ADC-characterising-output-voltage-signal to the processor, and the processor is configured to determine an ADC-distortion-spectrum based on a difference between (i) the digitized-voltage-representation of the ADC-characterising-output-voltage-signal; and (ii) an ADC-characterising-input-signal supplied to the amplifier to generate the ADC-characterising-output-voltage-signal.

13. The speaker driver of claim 12, wherein the processor is configured to determine the time-averaged-frequency-spectrum-block based on the ADC-distortion-spectrum.

14. An electronic device or an integrated circuit comprising the speaker driver of claim 1.

15. A method of testing a speaker comprising:
   receiving a test signal at an amplifier input terminal of an amplifier, wherein the test signal comprises a series of a plurality of equivalent test-blocks; and
   providing measurement-signalling, for a speaker, at an amplifier output of the amplifier, the measurement-signalling comprising a series of a plurality of measurement-blocks, wherein each of the measurement-blocks corresponds to an output of the amplifier for one of the plurality of test-blocks;
   measuring a current level of the measurement-signalling in order to provide sensed-signalling, wherein the sensed-signalling comprises a plurality of sensed-blocks, wherein each of the plurality of sensed-blocks corresponds to one of the plurality of measurement-blocks of the measurement-signalling; and either:
   combining the plurality of sensed-blocks to provide a time-averaged-block; and
      determining a frequency-spectrum of the time-averaged-block to provide a time-averaged-frequency-spectrum-block; or
   determining a frequency-spectrum of each of the plurality of sensed-blocks to provide a plurality of frequency-spectrum-sensed-blocks; and
      combining the plurality of frequency-spectrum-sensed-blocks to provide a time-averaged-frequency-spectrum-block.

* * * * *